US010719635B2

(12) United States Patent
Degen et al.

(10) Patent No.: US 10,719,635 B2
(45) Date of Patent: Jul. 21, 2020

(54) DIGITAL BRIDGE FOR DRAWING AND CONFIGURATION TOOLS

(71) Applicant: Siemens Industry, Inc., Alpharetta, GA (US)

(72) Inventors: Heinrich Helmut Degen, Plainsboro, NJ (US); Holger Schmidt, Saint Johns, FL (US); Nathan Clanney, Corona, CA (US)

(73) Assignee: Siemens Mobility, Inc., New York, NY (US)

( * ) Notice: Subject to any disclaimer, the term of this patent is extended or adjusted under 35 U.S.C. 154(b) by 393 days.

(21) Appl. No.: 15/722,613

(22) Filed: Oct. 2, 2017

(65) Prior Publication Data

US 2019/0102485 A1    Apr. 4, 2019

(51) Int. Cl.
*G06F 13/30*     (2006.01)
*G06F 9/54*      (2006.01)
*G06F 30/13*     (2020.01)
*G06Q 10/00*     (2012.01)

(52) U.S. Cl.
CPC ............. *G06F 30/13* (2020.01); *G06F 9/54* (2013.01); *G06Q 10/00* (2013.01)

(58) Field of Classification Search
USPC ............. 703/1, 2, 22, 24; 370/352, 395.3; 455/456.1
See application file for complete search history.

(56) References Cited

U.S. PATENT DOCUMENTS

| | | | | |
|---|---|---|---|---|
| 4,825,433 A * | 4/1989 | Deschaine | ............ | H04M 3/561 370/261 |
| 5,450,409 A * | 9/1995 | Diaz | ............ | H04J 3/0682 370/470 |
| 7,145,898 B1 * | 12/2006 | Elliott | ............ | H04L 12/66 370/352 |
| 8,194,646 B2 * | 6/2012 | Elliott | ............ | H04L 12/14 370/230 |
| 8,436,753 B2 * | 5/2013 | Eagleston | ............ | G10H 1/00 341/50 |
| 8,899,477 B2 * | 12/2014 | Gelman | ............ | G07F 17/32 235/380 |
| 2009/0109959 A1 * | 4/2009 | Elliott | ............ | H04L 12/14 370/352 |
| 2014/0018097 A1 * | 1/2014 | Goldstein | ............ | G06F 19/00 455/456.1 |
| 2014/0024956 A1 * | 1/2014 | Purdy | ............ | A61B 5/742 600/488 |
| 2016/0034608 A1 * | 2/2016 | Delplace | ............ | G06F 17/5004 703/1 |
| 2016/0299958 A1 * | 10/2016 | Kumar | ............ | G06F 16/9024 |
| 2017/0011768 A1 * | 1/2017 | Cho | ............ | G11B 20/0021 |
| 2018/0096706 A1 * | 4/2018 | Kim | ............ | G11B 20/1833 |
| 2018/0343348 A1 * | 11/2018 | Boyce | ............ | G06F 1/189 |

* cited by examiner

*Primary Examiner* — Thai Q Phan

(57) ABSTRACT

A computer implemented digital bridge that reduces the time and costs associated with designing and configuring hardware and/or logic for an application while also reducing the potential for errors during the process.

16 Claims, 2 Drawing Sheets

DIGITAL BRIDGE FOR DRAWING AND CONFIGURATION TOOLS

BACKGROUND

1. Field

Embodiments disclosed herein relate to tools required for the design and configuration of a system or application and, more particularly, to a digital bridge for drawing and configuration tools.

2. Description of the Related Art

In railroad applications, an interlocking is the arrangement of signals, switches and other equipment that prevents conflicting train movements through a portion of a railroad track (e.g., junctions or crossings). In essence, an interlocking is designed to prevent the displaying of a signal for a train to proceed through the portion of the track unless the route to be used is declared safe. The components of the interlocking are typically referred to as interlocking hardware. Interlocking hardware needs to be selected, installed and configured using a multi-step and multi-tool process.

For example, the typical first step is site planning. During this step, the hardware and input/output (I/O) ports must be selected. Mnemonics are often assigned to the I/O ports. In the context of the interlocking hardware, this may involve selecting the type of box, the cards that populate the box and determining what cards control what features and/or equipment. The typical second step relates to the configuration of the hardware (i.e., hardware configuration). In this step, hardware configuration parameters are determined and/or selected. The typical third step relates to the definition of any necessary logic for the interlocking (i.e., logic definition). Logic definition often requires the definition of equations implemented by the interlocking hardware.

The site planning step is often performed by the site planner using a drawing tool such as e.g., a computer-aided design (CAD) tool, generally referred to herein as "tool 1." The output of tool 1 and therefore the site planning step is documented in drawings as e.g., PDF files and/or paper printouts. The hardware configuration and logic definition steps are performed in a computer implemented software configuration tool, generally referred to herein as "tool 2." Tool 2 is typically used by an application engineer and usually requires some of the same data the site planner entered into tool 1. Hereinafter, the site planner and application engineer are generally referred to as a "user" or collectively "users" of tools 1 and 2. Currently, a user must enter the data used for tool 1 and the same or a different user must manually re-enter some or all of the same data into tool 2. As can be appreciated, the manual entry and re-entry of the same data into different tools is time consuming, labor intensive and subject to data entry errors. All of which are undesirable.

Accordingly, there is a need and desire for a mechanism for reducing the time and costs associated with designing and configuring hardware and/or logic for an application while also reducing the potential for errors during the process.

SUMMARY

Embodiments disclosed herein provide a computer implemented digital bridge that reduces the time and costs associated with designing and configuring hardware and/or logic for an application while also reducing the potential for errors during the process.

In one embodiment, a non-transitory computer-readable storage medium is provided. The medium stores a program implementing a digital bridge, the program including one or more sets of instructions that, when executed by the one or more processors, cause the processors to perform operations comprising: identifying and extracting first project data from one or more output features of a first computer-implemented tool executed on a first computer device; storing the identified and extracted first project data in a first project data structure; converting the stored first project data within the first project data structure into one or more formats for transferring the stored first project data to a second computer-implemented tool executed on a second computer device; storing the converted first project data on the one or more non-transitory mediums respectively associated with the one or more formats; at the second computer device, inputting the stored converted first project data from the one or more non-transitory mediums; converting the input stored converted first project data into second project data for storage in a second project data structure; and storing the second project data in the second project data structure.

In another embodiment, a non-transitory computer-readable storage medium is provided. The medium stores a program including one or more sets of instructions that, when executed by the one or more processors, cause the processors to perform operations comprising a digital bridge. The digital bridge comprises a plurality of feature mechanisms adapted to identify and extract first project data from one or more output features of a first computer-implemented tool executed on a first computer device, and being adapted to store the identified and extracted first project data in a first project data structure; a first set of converters adapted to convert the stored first project data within the first project data structure into one or more formats for transferring the stored first project data to a second computer-implemented tool executed on a second computer device, and being adapted to store the converted first project data on the one or more non-transitory mediums respectively associated with the one or more formats; and a second set of converters, at the second computer device, adapted to input the stored converted first project data from the one or more non-transitory mediums, convert the input stored converted first project data into second project data for storage in a second project data structure and to store the second project data in the second project data structure.

Further areas of applicability of the present disclosure will become apparent from the detailed description, drawings and claims provided hereinafter. It should be understood that the detailed description, including disclosed embodiments and drawings, are merely exemplary in nature intended for purposes of illustration only and are not intended to limit the scope of the invention, its application or use. Thus, variations that do not depart from the gist of the invention are intended to be within the scope of the invention.

BRIEF DESCRIPTION OF THE DRAWINGS

Like reference symbols in the various drawings indicate like elements

DETAILED DESCRIPTION

The components and materials described hereinafter as making up the various embodiments are intended to be illustrative and not restrictive. Many suitable components and materials that would perform the same or a similar function as the materials described herein are intended to be embraced within the scope of embodiments of the present invention.

Figure 1:
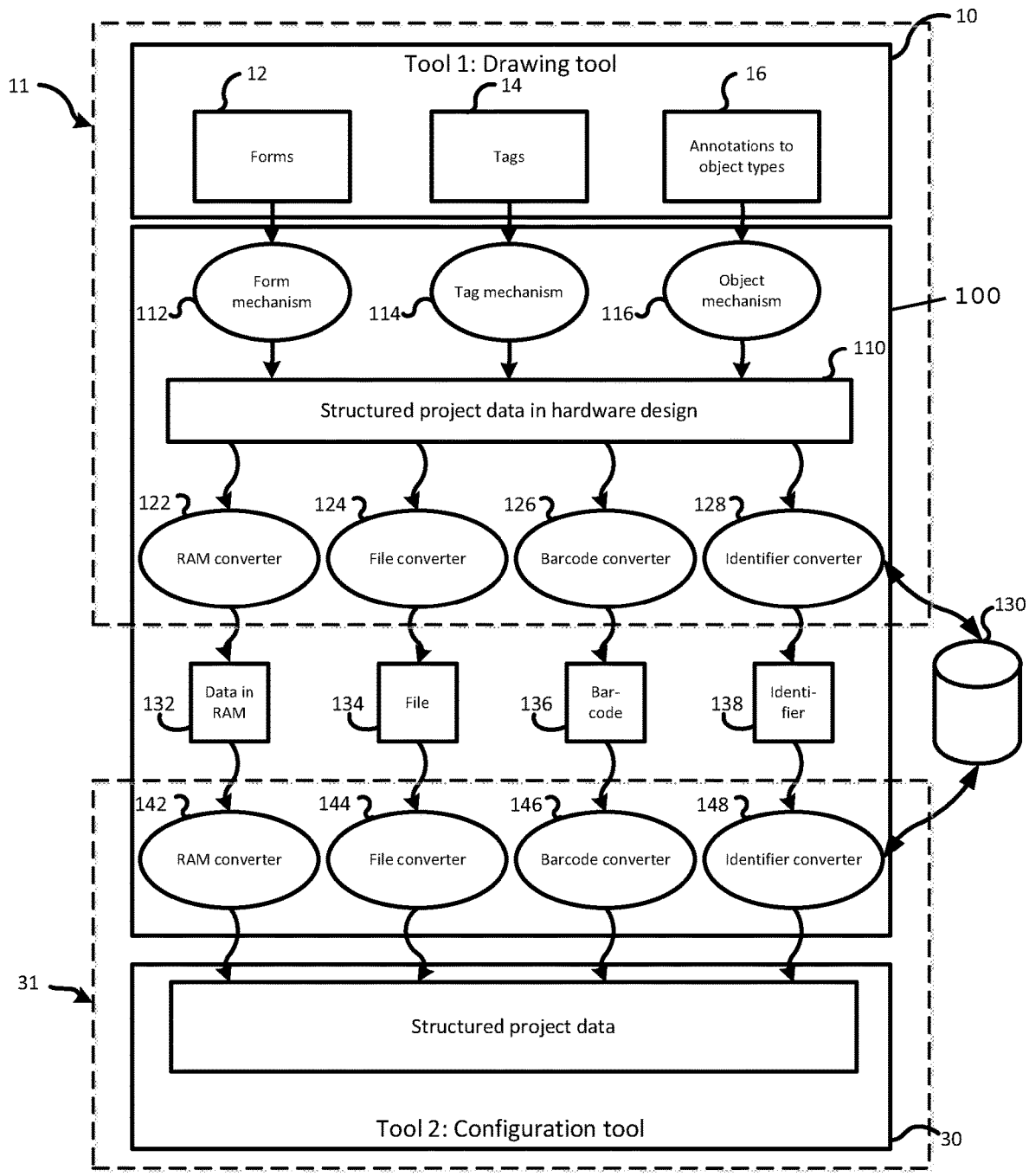
FIG. 1 illustrates an example digital bridge constructed in accordance with the disclosed principles.

FIG. 1 illustrates an example digital bridge 100 constructed in accordance with the disclosed principles. The bridge 100 is connected between a first tool 10 and a second tool 30. In the illustrated embodiment, the bridge 100 is connected such that it inputs data from outputs of the first tool 10 and provides that data to an input of the second tool 30. In one implementation, a portion of the bridge 100 is implemented on the same computer or workstation 11 that the first tool 10 is being executed on and another portion of the bridge 100 is implemented on the same computer or workstation 31 that the second tool 30 is being executed on. Moreover, and as discussed below, part of the bridge 100 can include components external to the computers/workstations that the first and second tools 10, 30 are being executed on.

In the illustrated embodiment, the first tool 10 is a drawing tool such as e.g., computer-aided design (CAD) tool, also referred to herein as "tool 1." In addition, in the illustrated embodiment, the second tool 30 is a computer implemented software configuration tool, also referred to herein as "tool 2." In one embodiment, RSLogix Micro Starter Lite from Rockwell Automation could be used as one of the tools.

The first tool 10 is used by a site planner to select and map out e.g., any hardware and I/O ports required for the intended application. As noted above, mnemonics are often assigned to the I/O ports. In the context of an interlocking hardware application, this may involve selecting the type of box, the cards that populate the box and determining what cards control what features and/or equipment. The first tool 10 may provide an output comprising one or more drawings as e.g., PDF files and/or paper printouts.

The first tool 10 also has project data that needs to be entered into the second tool 30 at a subsequent time. As discussed above, manual entry of this data into the second tool 30 is undesirable for several reasons. Accordingly, the digital bridge 100 disclosed herein is configured to identify this data, structure, convert, store, reconfigure and/or make the data accessible to the second tool 30 in one or more ways without manual data entry (or re-entry) of data previously entered into tool 1.

In the illustrated embodiment, project data in the first tool 10 maybe found in forms 12, tags 14 and drawing annotations 16. Therefore, the digital bridge 100 must be capable of identifying project data that needs to be transferred to the second tool 30 from the forms 12, tags 14 and drawing (and/or drawing objects) annotations 16. As such, the digital bridge 100 comprises a form mechanism 112 adapted to identify and read out/extract data from the forms 12. The digital bridge 100 also comprises a tag mechanism 114 adapted to look at the dedicated tags 14 and identify and read out/extract data from the tags 14. In addition, the digital bridge 100 comprises an object mechanism 116 adapted to look at annotations in the drawings or drawing objects 16 and identify and read out/extract data from the drawings or drawing objects 16.

Each mechanism 112, 114, 116 is adapted to output the read out/extracted project data into a project data structure 110 stored and maintained within the bridge 100. In one embodiment, the project data is organized by data types and each data type can be instantiated with a data value. For example, for a railroad application a first data type may be "Railroad". A corresponding data value for this data type could be "CSX". Another example data type could be "Chassis" and a corresponding a data value could be "9-slot chassis model A". The drawing created with the first tool 10 would include the railroad name "CSX" (data value). The value "CSX" is tagged with the data type "Railroad." Similarly, the drawing created with the first tool 10, would include a chassis "9-slot chassis model A" which is tagged with data type "chassis" and with the data value "9-slot chassis model A".

As described above, the digital bridge 100 reads the data values from artifacts, created in the first tool 10, which are tagged with known data types (e.g., Railroad, Chassis) and are associated with a data value (e.g., CSX, 9-slot chassis). This is information is stored in the project data structure 110 that is maintained within the bridge 100.

Once in the data structure 110, the project data is converted to make it available to and suitable for transfer to the second tool 30 by any number of means. For example, in the illustrated embodiment, the digital bridge 100 comprises a first set of four converters 122, 124, 126, 128 connected to input the project data from the data structure 110 and adapted to convert, output and/or store the data in its own way.

For example, the first converter, referred to herein as a RAM converter 122, reads the data out of the data structure 110, converts it to a form suitable for storing in a random access memory (RAM) 132, and stores the converted data in the RAM 132. It should be appreciated that the RAM 132 may be any type of random access memory (i.e., volatile or non-volatile).

The second converter, referred to herein as a file converter 124, reads the data out of the data structure 110, converts it to a form suitable for storing in a data file 134, and stores the converted data in the file 134. The file 134 can have any format or extension and should not be limited to any particular file type or format.

The third converter, referred to herein as a barcode converter 126, reads the data out of the data structure 110 and encodes it into a barcode 136 that can be printed and/or stored for later use. The fourth converter, referred to herein as an identifier converter 128, reads the data out of the data structure 110, converts it to a form suitable for storing in an external storage medium 130, and stores the converted data in the storage medium 130. The external storage medium 130 can be a cloud-based or other network-based or non-network based storage medium. The data can be accessed using an identifier such as e.g., a network address, hyperlink or other form of identifier known in the art. The identifier can be encoded in a barcode, referred to herein as an identifier barcode 138, by the identifier converter 128 so that the data can be accessed by scanning the identifier bar code 138. In some embodiments, the barcodes 136, 138 could be other types of digital codes (e.g., a quick response code (QR) code).

At this point, the project data may be populated into the second tool 30, which may access the data from the RAM 132, file 134, barcode 136 and/or external storage 130 (via the identifier barcode 138). To do so, the digital bridge 100 comprises a second set of converters 142, 144, 146, 148 that are used to access the project data from the RAM 132, file 134, barcode 136 and/or external storage 130 (via identifier barcode 138), respectively, convert the data and store the converted data into a project database 32 stored within and/or accessible by the second tool 30. As can be appreciated, the data within the project database 32 is converted/formatted for use with the type and format of the data used by the second tool 30.

The second tool 30 has entry forms that are tagged with data types. Once the digital bridge 100 is instantiated at the second tool 30, it looks for a matching data type in the second tool 30 (e.g., Railroad, Chassis). If it finds one, it automatically assigns the associated data value to the matching data type in the second tool 30. That is, the underlying principle is that the digital bridge 100 pulls from the first tool 10 and pushes to the second tool 30. In another embodiment, the first tool 10 assigns the data values to the corresponding data types of the digital bridge 100 and the second tool 30 reads the data values from the digital bridge 100 if it finds matching data types. That is, the underlying principle is that the first tool 10 pushes information to the digital bridge 100 and the second tool 30 pulls from the digital bridge 100. In one embodiment, the digital bridge 100 automatically identifies data types from the artifacts of the first and second tools 10, 30, updates the data type structures and then uses them as described herein.

In the illustrated embodiment, a second RAM converter 142 is used to read the data from the RAM 132, convert/format the read out data for storage into the project database 32 of the second tool 30, and store the converted/formatted data in the project database 32. A second file converter 144 is used to read the data from the file 134, convert/format the read out data for storage into the project database 32 of the second tool 30, and store the converted/formatted data in the project database 32.

A second barcode converter 146 is used to read the data by decoding the barcode 136, convert/format the read out data for storage into the project database 32 of the second tool 30, and store the converted/formatted data in the project database 32. A second identifier converter 148 is included to decode the identifier barcode 138 to retrieve the identifier/link needed to read the data from the external storage 130. As noted above, the identifier can be a network address, hyperlink or other form of identifier known in the art. Once the data is read from the external storage 130 (using the identifier), the second identifier converter 148 converts/formats the read out data for storage into the project database 32 of the second tool 30, and stores the converted/formatted data in the project database 32. It should be appreciated that if the barcodes 136, 138 are implemented as barcodes (as opposed to other codes (e.g., QR codes)), the converters 146, 148 will include bar code readers. If the barcodes 136, 138 are implemented as other types of codes (e.g., QR codes), the converters 146, 148 will include the appropriate form of reader for those codes.

Once the project database 32 of the second tool 30 is populated, the application engineer can configure the application's hardware without having to enter any data previously entered by the site planner into the first tool 10. Accordingly, the disclosed principles offer many advantages over the existing computer implemented design and configuration tools and process. For example, the digital bridge 100 saves time because manual entry of the selected hardware and hardware configuration parameters into the second tool 30 is not required. Moreover, the digital bridge 100 significantly reduces data entry errors as the configuration information is populated automatically instead of manually.

The disclosed principles provide these and other advantages for many technical fields of use. For example, and as discussed above, one use of the disclosed digital bridge 100 is in the creation of application logic for interlocking hardware used in the railroad industry. A site planner creates a drawing with a drawing tool such as e.g., a CAD tool (the first tool 10 in this implementation). The drawing usually contains the track layout, the location of the signals and switches and wiring details. It also includes the hardware chassis, the cards and the processor (interlocking hardware). Today, the drawing is printed and a printout is handed over to the application engineer. The application engineer re-enters some of the information on the drawing printout into the application software configuration tool (the second tool 30). The digital bridge 100 and the principles disclosed herein, however, automate this step, so that the application software configuration tool (the second tool 30) receives the information automatically and in a digital form from the drawing tool (the first tool 10) via the bridge 100. The application engineer can start defining the application logic by building on the received information. As discussed above, the digital bridge 100 makes the process more efficient and less error-prone.

Another example use of the disclosed digital bridge 100 is in the creation of industry automation solutions. A manufacturing planner creates a drawing with a drawing tool such as e.g., a CAD tool (the first tool 10). The drawing usually contains the manufacturing stations and belts for the automated process. The drawing also includes hardware selections, which must be configured at some point. Today, the drawing is printed and a printout is handed over to the industry automation engineer. The industry automation engineer re-enters some of the information on the drawing printout into the industry automation configuration tool (the second tool 30). The digital bridge 100 and the principles disclosed herein, however, automate this step, so that the industry automation configuration tool (the second tool 30) receives the information automatically and in a digital form from the drawing tool (the first tool 10) via the bridge 100. The industry automation engineer can start defining the industry automation logic by building on the received information. As discussed above, the digital bridge 100 makes the process more efficient and less error-prone.

Another example use of the disclosed digital bridge 100 is in the creation of energy generation solutions. An energy generation planner creates a drawing with a drawing tool such as e.g., a CAD tool (the first tool 10). The drawing usually contains the energy generation infrastructure. The drawing also includes hardware selections, which must be configured at some point. Today, the drawing is printed and a printout is handed over to the energy generation engineer. The energy generation engineer re-enters some of the information on the drawing printout into the energy generation configuration tool (the second tool 30). The digital bridge 100 and the principles disclosed herein, however, automate this step, so that the energy generation configuration tool (the second tool 30) receives the information automatically and in a digital form from the drawing tool (the first tool 10) via the bridge 100. The energy generation engineer can start defining the energy generation logic by building on the received information. As discussed above, the digital bridge 100 makes the process more efficient and less error-prone.

Another example use of the disclosed digital bridge 100 is in the creation of building technology solutions (e.g., the control of HVAC, fire detectors, heating, etc.). A building technology planner creates a drawing with a drawing tool such as e.g., a CAD tool (the first tool 10). The drawing usually contains the building technology infrastructure. The drawing also includes hardware selections, which must be configured at some point. Today, the drawing is printed and a printout is handed over to the building technology engineer. The building technology engineer re-enters some of the information on the drawing printout into the building technology configuration tool (the second tool 30). The digital bridge 100 and the principles disclosed herein, however, automate this step so that the building technology configuration tool (the second tool 30) receives the information automatically and in a digital form from the drawing tool (the first tool 10) via the bridge 100. The building technology engineer can start defining the building technology logic by building on the received information. As discussed above, the digital bridge 100 makes the process more efficient and less error-prone.

A discussed above, in one implementation, a portion of the digital bridge 100 is implemented on the same computer/workstation 11 that the first tool 10 is being executed on and another portion of the bridge 100 is implemented on the same computer/workstation 31 that the second tool 30 is being executed on. In the illustrated example, the form mechanism 112, tag mechanism 114, object mechanism 116, project data structure 110, and the first set of converters 122, 124, 126, 128 are implemented within the computer/workstation 11 executing the first tool 10. In addition, the second set of converters 142, 144, 146, 148 are implemented within the computer/workstation 31 executing the second tool 30. The RAM 132, file 134, barcode 136 and identifier barcode 138 are the interface between the first and second tools 10, 30 and can be located on an appropriate medium accessible by both computers/workstations 10, 30.

In one embodiment, the form mechanism 112, tag mechanism 114, object mechanism 116, project data structure 110, and the first set of converters 122, 124, 126, 128 are implemented as computer readable instructions stored on a non-transitory computer readable storage medium (e.g., RAM, ROM) that is executed by the first computer/workstation 11 to perform the processes discussed above for these components. Moreover, the second set of converters 142, 144, 146, 148 are implemented as computer readable instructions stored on a non-transitory computer readable storage medium (e.g., RAM, ROM) that is executed by the second computer/workstation 31 to perform the processes discussed above for these components.

Figure 2:
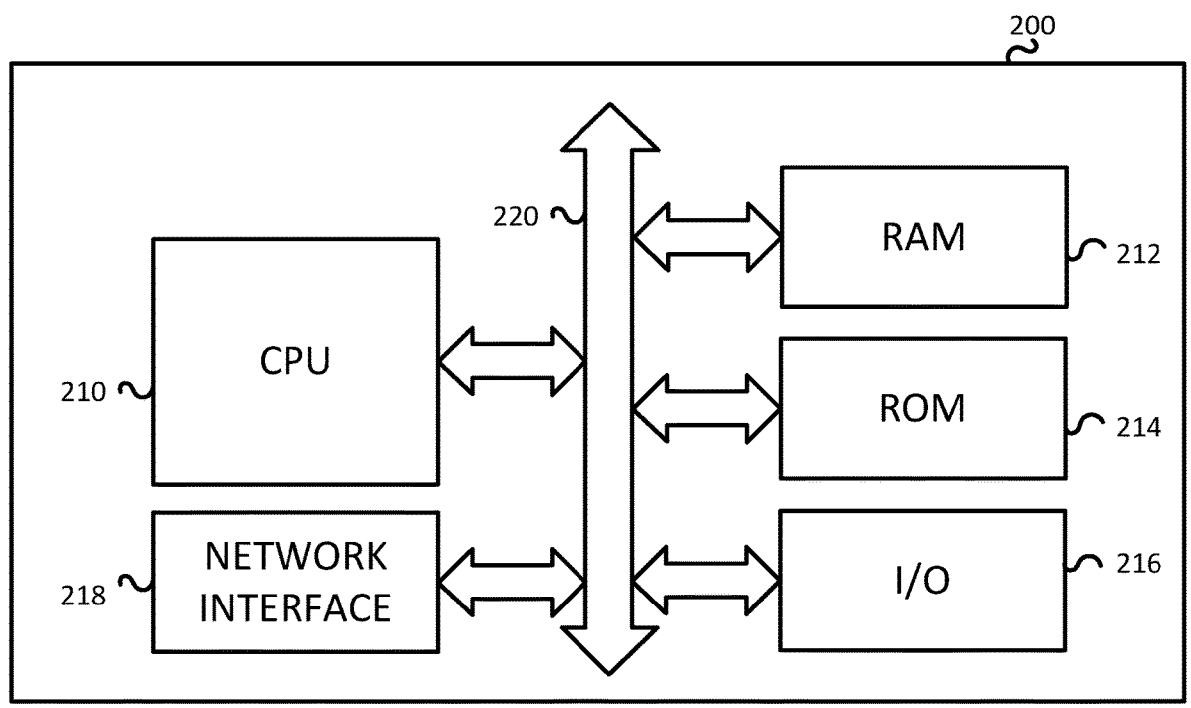
FIG. 2 illustrates an example computer system for implementing at least a portion of the example digital bridge illustrated in FIG. 1.

FIG. 2 illustrates an example computer system 200 for implementing at least the form mechanism 112, tag mechanism 114, object mechanism 116, project data structure 110, first set of converters 122, 124, 126, 128, and second set of converters 142, 144, 146, 148 of the example digital bridge 100 illustrated in FIG. 1. In the illustrated example, the system 200 includes a processor 210 (shown as a CPU) connected to one or more computer readable storage mediums such as RAM 212 and ROM 214 over one or more busses 220. The processor 210 is also in communication with one or more input/output (I/O) devices 216 (e.g., printer, memory stick, code generator) and a network interface 218, which may be required for functions performed by the digital bridge 100.

The foregoing examples are provided merely for the purpose of explanation and are in no way to be construed as limiting. Further areas of applicability of the present disclosure will become apparent from the detailed description, drawings and claims provided hereinafter. While reference to various embodiments is made, the words used herein are words of description and illustration, rather than words of limitation. Further, although reference to particular means, materials, and embodiments are shown, there is no limitation to the particulars disclosed herein. Rather, the embodiments extend to all functionally equivalent structures, methods, and uses, such as are within the scope of the appended claims.

Additionally, the purpose of the Abstract is to enable the patent office and the public generally, and especially the scientists, engineers and practitioners in the art who are not familiar with patent or legal terms or phraseology, to determine quickly from a cursory inspection the nature of the technical disclosure of the application. The Abstract is not intended to be limiting as to the scope of the present inventions in any way.

We claim:

1. A non-transitory computer-readable storage medium storing a program implementing a digital bridge, said program including one or more sets of instructions that, when executed by one or more processors, cause the one or more processors to perform operations comprising:
    identifying and extracting first project data from one or more output features of a first computer-implemented tool executed on a first computer device;
    storing the identified and extracted first project data in a first project data structure;
    converting stored first project data of the first project data structure into one or more formats for transferring the stored first project data to a second computer-implemented tool executed on a second computer device;
    storing converted first project data on one or more non-transitory mediums respectively associated with the one or more formats;
    at the second computer device, inputting the stored converted first project data from the one or more non-transitory mediums;
    converting input stored converted first project data into second project data for storage in a second project data structure; and
    storing the second project data in the second project data structure,
    wherein the first project data and the second project data are organized by data types, each data type having an associated data value,
    wherein, upon instantiation of the digital bridge at the second computer-implemented tool, the digital bridge searches for matching data types in the second project data of the second computer-implemented tool and automatically assigns an associated data value to a matching data type in the second computer-implemented tool.

2. The non-transitory computer-readable storage medium of claim 1, wherein the set of instructions for identifying and extracting the first project data comprises sets of instructions for identifying and extracting first project data from one or more of a form, tag or drawing output from the first tool.

3. The non-transitory computer-readable storage medium of claim 1, wherein the one or more formats comprises a first data format for storing the first project data in a random access memory, a second data format for storing the first project data in a file, a third data format for storing the first project data in a barcode, and a fourth data format for storing the first project data in an external storage medium.

4. The non-transitory computer-readable storage medium of claim 3, wherein the set of instructions for converting the stored first project data of the first project data structure into one or more formats comprises a set of instructions for:
    converting the stored first project data into the first, second, third and fourth formats;

storing the converted first project data in the first format in the random access memory;

storing the converted first project data in the second format in the file;

creating a first barcode with the converted first project data in the third format;

storing the converted first project data in the fourth format in the external storage; and creating a second barcode with an identifier associated with the external storage.

5. The non-transitory computer-readable storage medium of claim 3, wherein the set of instructions for inputting the stored converted first project data from the one or more non-transitory mediums comprises a set of instructions for:

inputting the stored converted first project data from the random access memory;

inputting the stored converted first project data from the file;

extracting the stored converted first project data from the first barcode;

extracting the identifier from the second barcode; and inputting the stored converted first project data from the external storage using the identifier.

6. The non-transitory computer-readable storage medium of claim 5, wherein the set of instructions for converting the input stored converted first project data into second project data comprises sets of instructions for:

converting the data input from the random access memory into second project data;

converting the data input from the file into second project data;

converting the data extracted from the first barcode into second project data; and converting the data input from the external storage into second project data.

7. The non-transitory computer-readable storage medium of claim 1, wherein the first tool comprises a drawing tool and the second tool comprises a configuration tool.

8. The non-transitory computer-readable storage medium of claim 1, wherein the first and second project data comprises data for one of interlocking hardware for a railroad application, manufacturing stations and belts for an automated process, energy generation infrastructure, or building technology infrastructure.

9. A system for converting and transferring project data comprising:

a digital bridge comprising:

a plurality of mechanisms identifying and extracting first project data from one or more output features of a first computer-implemented tool executed on a first computer device, and storing identified and extracted first project data in a first project data structure;

a first set of converters converting stored first project data of the first project data structure into one or more formats for transferring the stored first project data to a second computer-implemented tool executed on a second computer device, and storing converted first project data on one or more non-transitory mediums respectively associated with the one or more formats; and a second set of converters, at the second computer device, inputting the stored converted first project data from the one or more non-transitory mediums, converting input stored converted first project data into second project data for storage in a second project data structure and storing the second project data in the second project data structure, wherein the first project data and second project data are organized by data types, each data type having an associated data value, wherein the first computer-implemented tool assigns associated data values of the data types of the first project data to the digital bridge, and wherein the second computer-implemented tool reads the associated data values from the digital bridge in order to find matching data types in the second project data.

10. The system of claim 9, wherein the plurality of mechanisms identify and extract first project data from one or more of a form, tag or drawing output from the first computer-implemented tool.

11. The system of claim 9, wherein the one or more formats comprises a first data format for storing the first project data in a random access memory, a second data format for storing the first project data in a file, a third data format for storing the first project data in a barcode, and a fourth data format for storing the first project data in an external storage medium.

12. The system of claim 11, wherein the first set of converters:

convert the stored first project data into the first, second, third and fourth data formats;

store the converted first project data in the first data format in the random access memory;

store the converted first project data in the second data format in the file;

create a first barcode with the converted first project data in the third data format;

store the converted first project data in the fourth data format in the external storage medium; and create a second barcode with an identifier associated with the external storage medium.

13. The system of claim 11, wherein the second set of converters:

input the stored converted first project data from the random access memory;

input the stored converted first project data from the file;

extract the stored converted first project data from the first barcode;

extract the identifier from the second barcode; and input the stored converted first project data from the external storage medium using the identifier.

14. The system of claim 13, wherein the second set of converters:

convert the data input from the random access memory into second project data;

convert the data input from the file into second project data;

convert the data extracted from the first barcode into second project data; and convert the data input from the external storage medium into second project data.

15. The system of claim 9, wherein the first tool comprises a drawing tool and the second tool comprises a configuration tool.

16. The system of claim 9, wherein the first and second project data comprises data for one of interlocking hardware for a railroad application, manufacturing stations and belts for an automated process, energy generation infrastructure, or building technology infrastructure.

* * * * *